(12) United States Patent
Ji (10) Patent No.: US 6,807,407 B2
(45) Date of Patent: Oct. 19, 2004

(54) DUAL DOUBLE BALANCED MIXER

(75) Inventor: Daxiong Ji, Brooklyn, NY (US)

(73) Assignee: Scientific Components, Inc., Brooklyn, NY (US)

(*) Notice: Subject to any disclaimer, the term of this patent is extended or adjusted under 35 U.S.C. 154(b) by 662 days.

(21) Appl. No.: 09/846,083

(22) Filed: May 2, 2001

(65) Prior Publication Data

US 2002/0032016 A1 Mar. 14, 2002

Related U.S. Application Data

(60) Provisional application No. 60/231,729, filed on Sep. 11, 2000.

(51) Int. Cl.[7] .................................................. H04B 1/26
(52) U.S. Cl. ....................... 455/326; 455/313; 455/323; 455/314; 327/113
(58) Field of Search ................................ 455/313, 314, 455/318, 323, 326, 333; 327/113

(56) References Cited

U.S. PATENT DOCUMENTS

| | | | |
|---|---|---|---|
| 5,060,298 A | * 10/1991 | Waugh et al. | ............... 455/326 |
| 6,108,529 A | * 8/2000 | Vice et al. | ................... 455/323 |
| 6,275,687 B1 | * 8/2001 | Lloyd | ......................... 455/292 |
| 6,343,211 B1 | * 1/2002 | Thodesen et al. | ........... 455/317 |
| 6,438,563 B1 | * 8/2002 | Kawagoe | .................... 707/201 |

* cited by examiner

Primary Examiner—Nguyen T. Vo
Assistant Examiner—Nhan T. Le
(74) Attorney, Agent, or Firm—Kevin Redmond (57) ABSTRACT

A double balanced mixer for mixing an RF input signal with a local oscillator signal to provide at an output an intermediate frequency signal with a high third order intercept point. A first and second local oscillator balun receives a local oscillator signal. A first and second RF balun receives a RF signal. A first mixer is coupled to the first local oscillator balun and the first RF balun. A second mixer is coupled in parallel with the first mixer. The second mixer is coupled to the second local oscillator balun and the second RF balun. The parallel coupled mixers provide an intermediate frequency signal. A first intermediate frequency balun is coupled to the first mixer and a second intermediate frequency balun is coupled to the second mixer. The mixer also has increased isolation.

21 Claims, 14 Drawing Sheets

DUAL DOUBLE BALANCED MIXER

This application claims the benefit of Provisional Application 60/231,729, filed Sep. 11, 2000.

BACKGROUND OF THE INVENTION

1. Field of the Invention

This invention relates to mixers in general and more particularly to a dual double balanced mixer that minimizes inter-modulation products and has a high third order intercept point (IP3).

2. Description of the Prior Art

A mixer circuit converts an RF signal to an intermediate frequency (IF) signal which is the difference of the RF and a local oscillator (LO) signal. The IF frequency is obtained by multiplying the RF signal with the local oscillator (LO) signal. The difference or IF frequency is a result of the non-linearity of the mixer. Along with the IF frequency, the mixer typically generates intermodulation products due to the non-linearity response. Third order intermodulation products are close in frequency to the fundamental IF frequencies and therefore are difficult to remove by filtering. Third-order intermodulation distortion is a measure of the third-order products generated by a second input signal arriving at the input of a mixer along with the desired signal.

One technique to measure the suppression capability of a mixer is the "third-order intercept" approach. The third-order intercept point is a theoretical point on the RF input versus IF output curve where the desired output signal and third-order products become equal in amplitude as RF input is raised. The high end of the dynamic range of the mixer is defined as the maximum received signal power at which the mixer is designed to be used and is designated the 1 dB compression point or the input signal power level at which the power level of a third order product equals the power level of a fundamental IF signal is called the third order intercept point (IP3). A mixer with a higher IP3 value will have better performance. A mixer is usually specified in terms of input IP3. Output third order intercept point is the difference between input IP3 and conversion loss. Higher conversion losses result in lower output IP3.

Conversion loss is a measure of the efficiency of the mixer in providing frequency translation between the input RF signal and the output IF signal. Conversion loss of a mixer is equal to the ratio of the IF output to the RF input level.

Mixers are typically designed with one of three topologies: single ended, balanced, and double balanced. The double balanced mixers are capable of isolating both the RF signal and the local oscillator LO voltages from the output and thus allow overlap of the RF and IF frequency bandwidths. Several prior art mixer circuits are well known. One mixer design uses a schottky diode quad or ring circuit that uses four diodes with all of the diodes pointed in the same direction. Another mixer circuit is called a star circuit, which uses two diodes pointing toward the central node and two diodes pointing away from the central node. Unfortunately, mixers with schottky diodes are limited to an IP3 of 25 to 30 dBm. Schottky diode mixers approaching 30 dBm are difficult to tune and are expensive. Diode mixers also require large LO signal levels to obtain a high IP3 which is not practical in many systems.

Another type of mixer uses field effect transistors (FET) as the mixing element instead of a schottky diode. Mixers fabricated using FET's can achieve a higher value of IP3 greater than 30. Unfortunately, mixers using FET's have several other disadvantages such as higher conversion losses of approximately 9 dB, higher noise figure (conversion losses at +1 dB) and the need for DC current.

While double balanced diode and FET mixers have been used, none of these will give a high IP3 in a double balanced mixer configuration without substantial loss. A current unmet need exists for an improved double balanced mixer with that has a high third order intercept point, low conversion loss, low noise figure and does not require DC power.

SUMMARY OF THE INVENTION

It is a feature of the invention to provide a double balanced mixer for mixing an RF input signal with a local oscillator signal to provide at an output an intermediate frequency signal with a high third order intercept point.

Another feature of the invention is to provide a double balanced mixer that includes a first and second local oscillator balun that is operable to receive a local oscillator signal. A first and second RF balun is operable to receive a RF signal. A first mixer has a first input port coupled to the first local oscillator balun, a second input port coupled to the first RF balun, and an output port that provides an intermediate frequency signal. A second mixer is coupled in parallel with the first mixer. The second mixer has a first input port that is coupled to the second local oscillator balun, a second input port that is coupled to the second RF balun, and an output port that provides an intermediate frequency signal. A first intermediate frequency balun is coupled to the output port of the first mixer and a second intermediate frequency balun is coupled to the output port of the second mixer. The parallel connected first and second mixers provide a high third order intercept point. The first and second mixers are each field effect transistor quads.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

It is noted that the drawings of the invention are not to scale. In the drawings, like numbering represents like elements between the drawings.

DETAILED DESCRIPTION OF THE PREFERRED EMBODIMENT(s)

Figure 1:
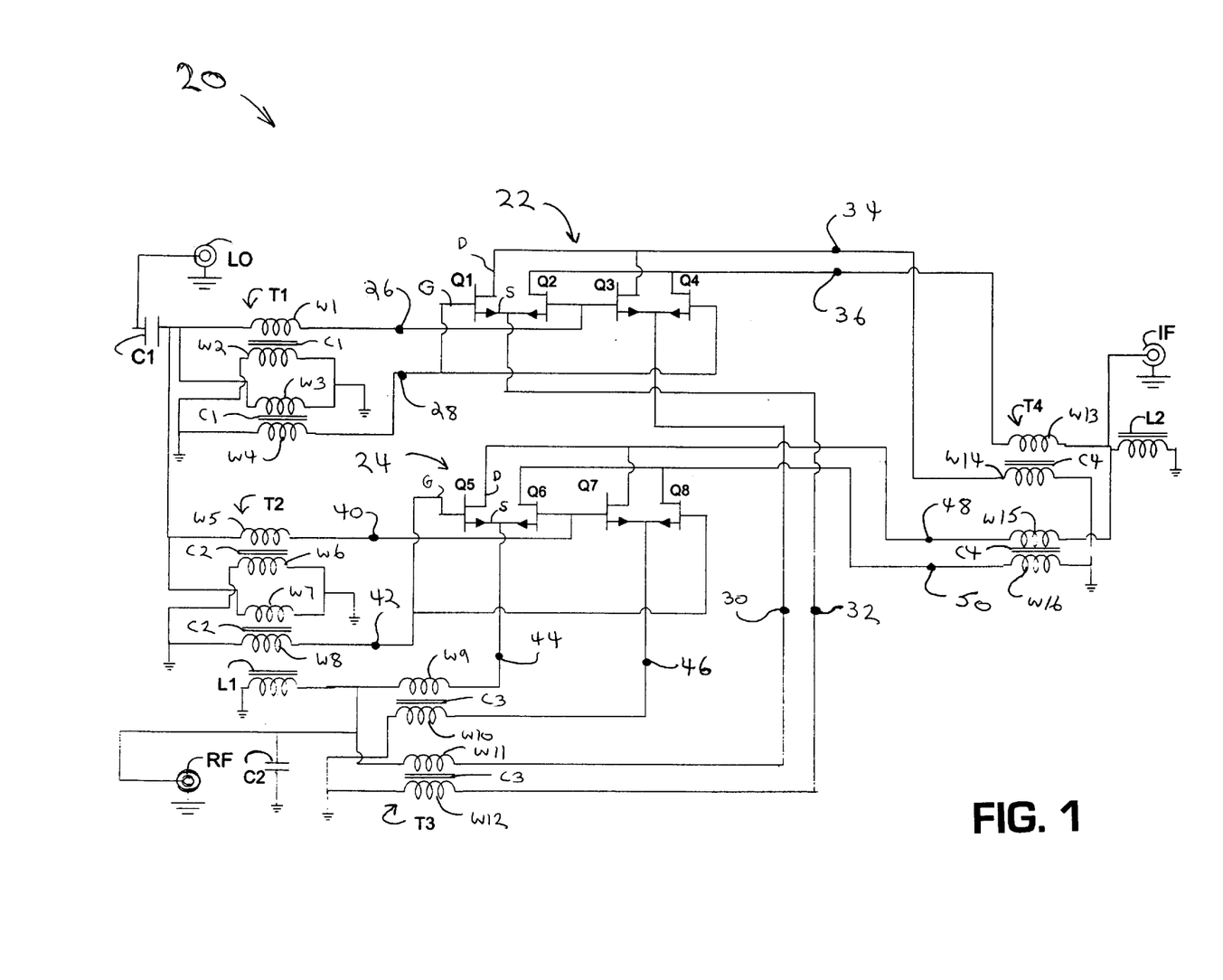
FIG. 1 is a schematic view of the preferred embodiment of a Dual Double Balanced Mixer.

Referring to FIG. 1, a schematic view of the preferred embodiment of a Dual Double Balanced Mixer according to the present invention is shown. Dual double balanced mixer 20 has a local oscillator input terminal LO for receiving a local oscillator signal, an RF input terminal RF for receiving an RF signal and an intermediate frequency output terminal IF for providing an intermediate frequency output signal. A first mixer 22 has first and second input ports 26 and 28 for receiving the local oscillator signal and third and a fourth input ports 30 and 32 for receiving the RF signal. The first mixer has first and second output ports 34 and 36 for providing the intermediate frequency signal from the mixer. A second mixer 24 is connected in parallel with mixer 22. Similar to mixer 22, mixer 24 has fifth and sixth input ports 40 and 42 for receiving the local oscillator signal and seventh and eighth input ports 44 and 46 for receiving the RF signal. Mixer 24 has third and fourth output ports 48 and 50 for providing the intermediate frequency signal.

Local oscillator terminal LO is connected to local oscillator baluns T1 and T2 through a matching capacitor C1. Balun T1 has wire windings W1, W2, W3 and W4 wound on a core C1. Balun T2 has wire windings W5, W6, W7 and W8 wound on a core C2. Winding W1 has one end connected to port 26 and the other end connected to capacitor C1. Winding W2 has both ends connected to ground. Winding W3 has one end connected to ground and the other end connected to capacitor C1. Winding W4 has one end connected to port 28 and the other end connected to ground. Winding W5 has one end connected to port 40 and the other end connected to capacitor C1. Winding W6 has both ends connected to ground. Winding W7 has one end connected to ground and the other end connected to capacitor C1. Winding W8 has one end connected to port 42 and the other end connected to ground. Thus the local oscillator signal is connected to the mixers through baluns T1 and T2.

RF input terminal RF is connected to RF balun T3. A matching capacitor C2 is connected between the RF terminal RF and ground. Balun T3 has wire windings W9, W10, W11 and W12 wound on a core C3. Winding W9 has one end connected to port 44 and the other end connected to RF terminal RF. Winding W10 has one end connected to ground and the other end connected to port 46. Winding W11 has one end connected to RF terminal RF and the other end connected to port 30. Winding W12 has one end connected to port 32 and the other end connected to ground. Thus the RF signal is connected to the mixers through balun T3. An inductor L1 has one end connected to ground and the other end connected to a junction of terminal RF, and ends of windings W9 and W11. Inductor L1 is a DC return for the RF signal.

IF output terminal IF is connected to IF balun T4. Balun T4 has wire windings W13, W14, W15 and W16 wound on a core C4. Winding W13 has one end connected to port 36 and the other end connected to IF terminal IF. Winding W14 has one end connected to ground and the other end connected to port 34. Winding W15 has one end connected to IF terminal IF and the other end connected to port 48. Winding W16 has one end connected to port 50 and the other end connected to ground. Thus the IF signal is connected to the mixers through balun T4. An inductor L2 has one end connected to ground and the other end connected to a junction of terminal IF, and ends of windings W13 and W15. Inductor L2 is a DC return for the IF signal. It is noted that no external DC current is required for the mixer.

Mixers 22 and 24 are each comprised of field effect transistor (FET) quads or four field effect transistors. Mixer 22 has transistors Q1, Q2, Q3 and Q4. Mixer 24 has transistors Q5, Q6, Q7 and Q8. The field effect transistors are preferably metal oxide semiconductor field effect transistors (MOSFETS). In mixers 22 and 24 each of the field effect transistor quads are connected as follows, with mixer 22 detailed as an example: Each field effect transistor has a gate (G), a drain (D) and a source (S) electrode. The source electrodes of transistors Q1 and Q2 are connected together to form RF input port 32. The source electrodes of transistors Q3 and Q4 are connected together to form RF input port 30. The drain electrodes of transistors Q1 and Q3 are connected together to form output port 34. The drain electrodes of transistors Q2 and Q4 are connected together to form port 36. The gate electrodes of transistors Q2 and Q3 are connected together to form LO input port 26. The gate electrodes of transistors Q1 and Q4 are connected together to form LO input port 28. Transistors Q5, Q6, Q7 and Q8 are similarly connected to form mixer 24. The preferred field effect transistors are fabricated from ultra thin silicon in a CMOS process that can switch at moderate local oscillator power levels on the order of less than 17 dBm per FET quad or 20 dBm per both FET quads.

Figure 2:
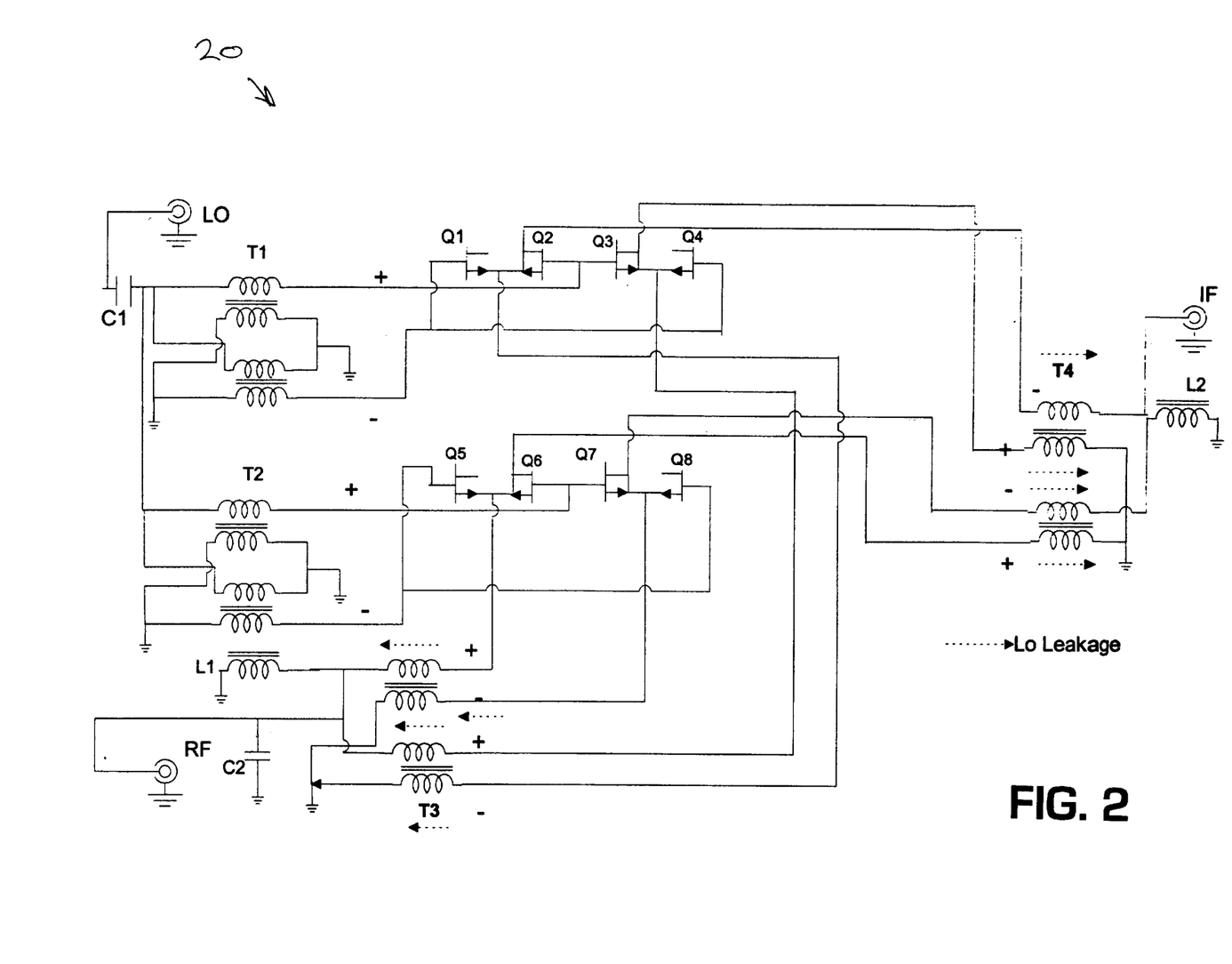
FIG. 2 shows the operation of the circuit of FIG. 1 when the local oscillator signal is positive.

Referring to FIG. 2, the operation of the circuit of FIG. 1 when the local oscillator signal is positive is shown. During the positive half of the LO signal, field effect transistors Q2, Q3, Q6 and Q7 are turned on. This is represented by the shorted source to drain connections as shown in FIG. 2. The connections to the baluns T3 and T4 are opened or removed. The RF input signal flows to the IF output terminal as indicated by the plus + and minus − signals adjacent the windings of balun T4. The polarity of the signals arriving at balun T4 is additive. Leakage of the local oscillator signal LO at the RF and IF terminals are indicated by the broken or dashed arrows. The polarity of the signals are such that there is complete cancellation of the leakage signals at the IF port, if the baluns are ideal. In reality baluns are not ideal. Therefore, the configuration of these baluns is self compensating.

Figure 3:
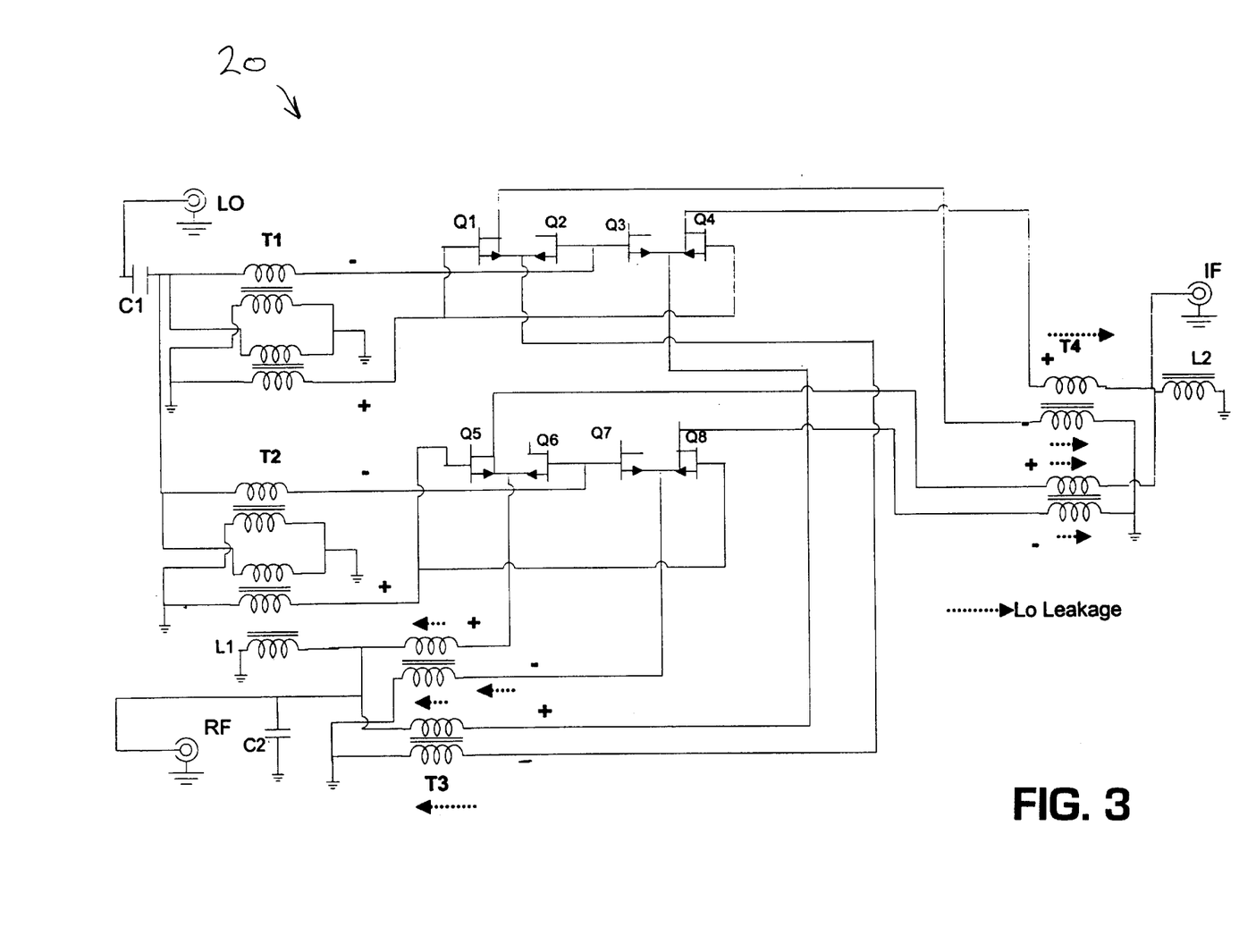
FIG. 3 shows the operation of the circuit of FIG. 1 when the local oscillator signal is negative.

FIG. 3 shows the operation of the circuit of FIG. 1 when the local oscillator signal is negative. During the negative half of the LO signal, field effect transistors Q1, Q4, Q5 and Q8 are turned on and the other transistors are off. This is represented by the shorted source to drain connections as shown in FIG. 3. The connections to the baluns T3 and T4 are removed. The RF input signal flows to the IF output port as indicated by the plus + and minus − signals adjacent the windings of balun T4. Note that the polarity of the signals arriving at balun T4 is reversed from FIG. 2. The result is that the RF signal at the IF port is reversed at the IF port every half cycle of the LO input signal. This is equivalent to mathematical multiplication of the signal and the signals are mixed. Leakage of the local oscillator signal LO at the RF and IF terminals are indicated by the broken or dashed arrows. The polarity of the signals are such that there is complete cancellation of the leakage signals at the IF port, if the baluns are ideal. In reality, baluns are not ideal. Therefore, the configuration of these baluns is self compensating.

Figure 4:
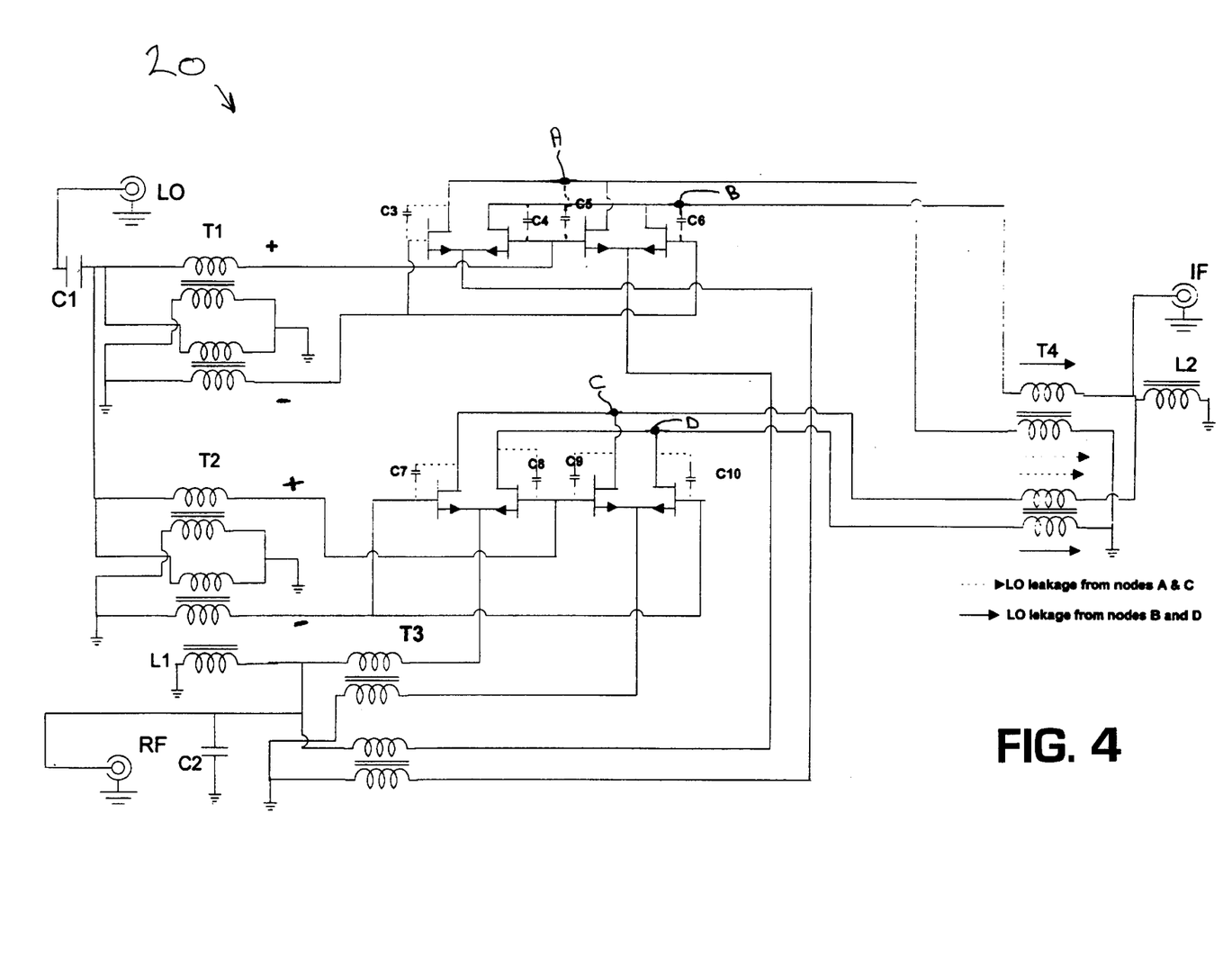
FIG. 4 shows balun and FET unbalance referred to as L-I isolation for the circuit of FIG. 1.

Turning now to FIG. 4, the effect of local oscillator LO leakage on the IF terminal for the circuit of FIG. 1 is shown. This is balun and FET unbalance and is called L-I isolation. The sources of imbalance are the baluns T1, T2 and the gate to drain capacitance of the field effect transistors. This capacitance is represented as capacitors C3, C4, C5, C6, C7, C8, C9 and C10 as shown between the gate and drains of FIG. 4. Referring to node A in FIG. 4, two signals arrive at this node. One signal comes from the positive side of balun T1 through capacitor C5. The other signal comes from the negative side of balun T1 through capacitor C3. At node C, two signals are arriving. One signal from the positive side of balun T2 through capacitor C9. The other signal comes from the negative side of balun T2 through capacitor C7. Baluns T1 and T2 can be made nearly identical to each other. Capacitors C5–C9 and C3–C7 can also be closely matched. Therefore, the potentials at node A and node C are the same. Following the signal paths through to balun T4 results in the LO leakage canceling in balun T4. Similarly, nodes B and D are at equal potential and the signals will cancel in balun T4. An L-I isolation of 35 to 40 dB was obtained for the dual mixer. For comparison, a single mixer only provided 18 to 20 dB of isolation.

Figure 5:
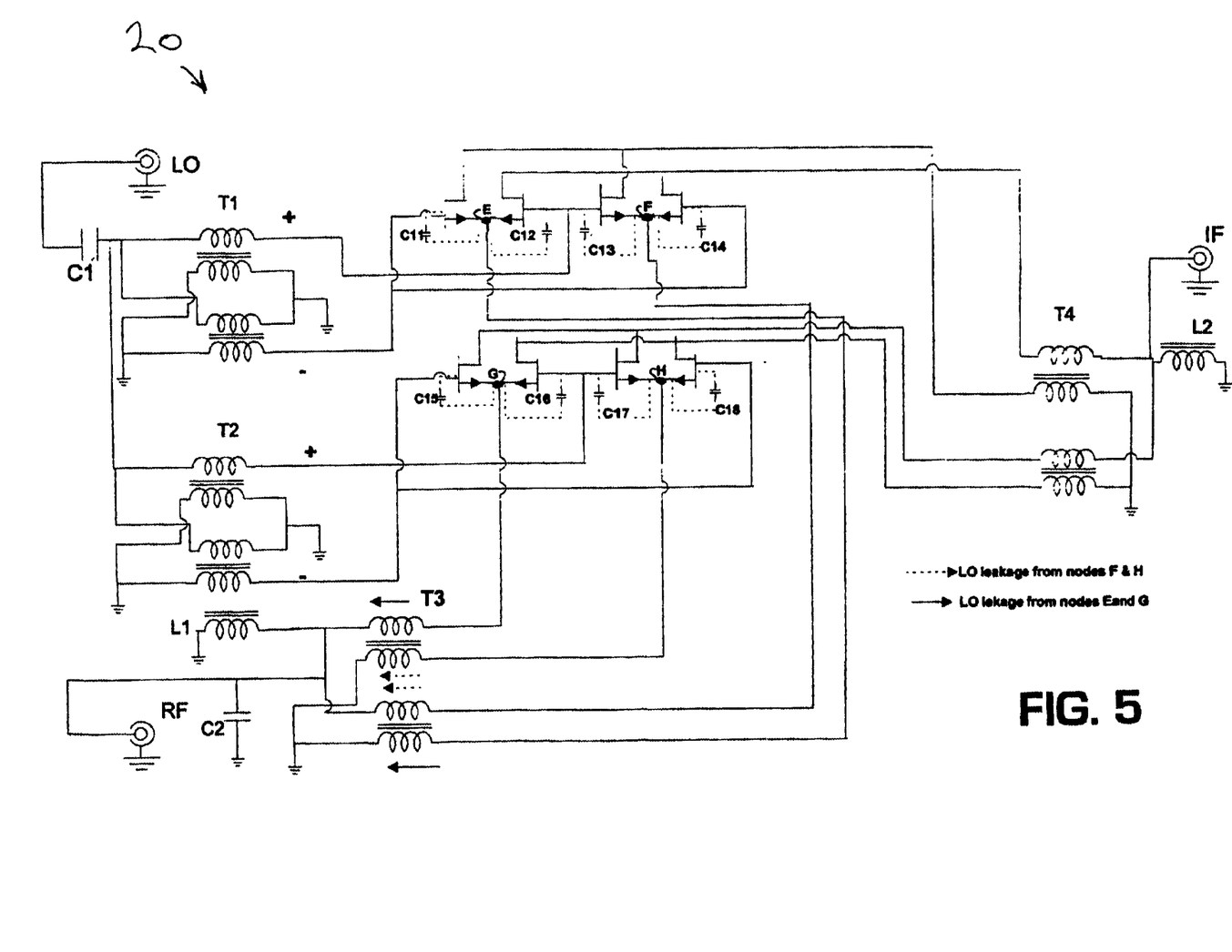
FIG. 5 shows balun and FET unbalance referred to as L-R isolation for the circuit of FIG. 1.

Turning now to FIG. 5, the effect of local oscillator LO leakage on the RF terminal for the circuit of FIG. 1 is shown. This is balun and FET unbalance and is called L-R isolation. The sources of imbalance are the baluns T1, T2 and the gate to source capacitance of the field effect transistors. This capacitance is represented as capacitors C11, C12, C13, C14, C15, C16, C17 and C18 as shown between the gate and source of FIG. 5. Referring to node E in FIG. 5, two signals arrive at this node. One signal comes from the positive side of balun T1 through capacitor C12. The other signal comes from the negative side of balun T1 through capacitor C11. At node G, two signals are arriving. One signal from the positive side of balun T2 through capacitor C16. The other signal comes from the negative side of balun T2 through capacitor C15. Baluns T1 and T2 can be made nearly identical to each other. Capacitors C12–C16 and C11–C15 can also be closely matched. Therefore, the potentials at node E and node G are the same. Following the signal paths through to balun T3 results in the LO leakage canceling in balun T3. Similarly, nodes F and H are at equal potential and the signals will cancel in balun T3.

Figure 6:
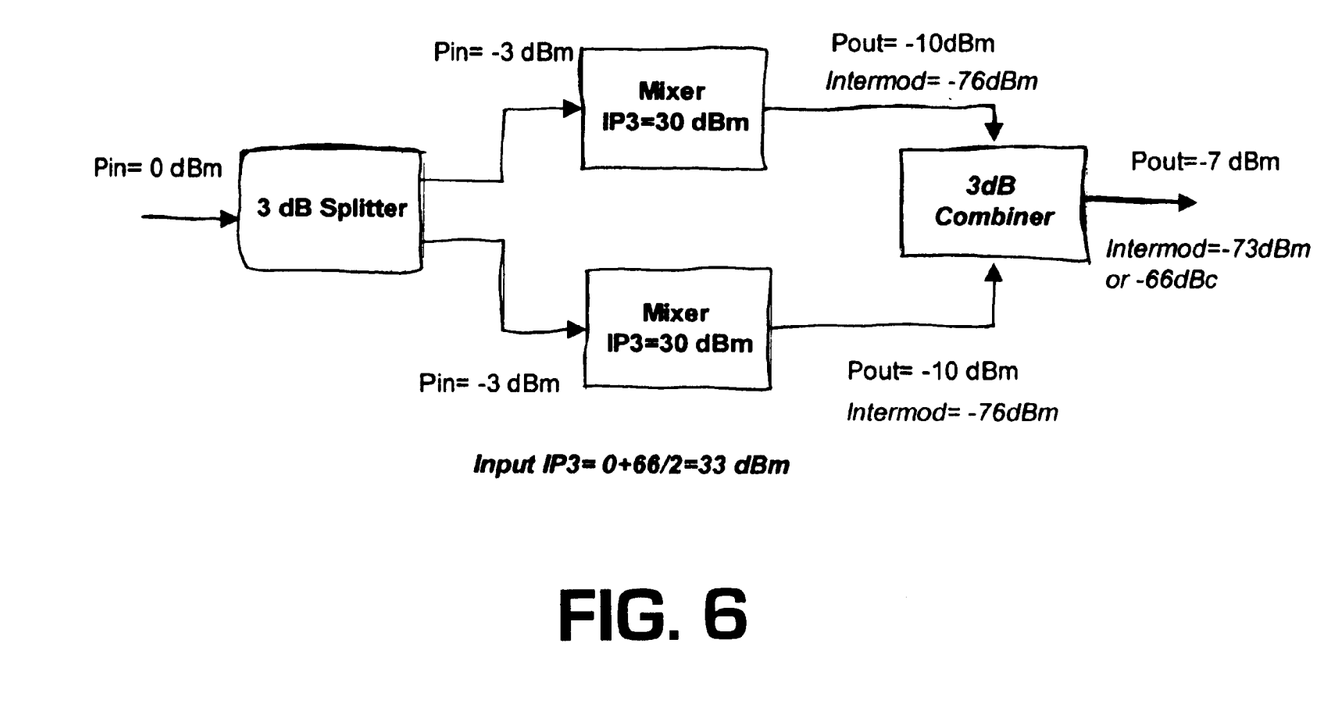
FIG. 6 shows the effect of the circuit of FIG. 1 on third order intercept point (IP3).

Referring to FIG. 6, the effect of the circuit of FIG. 1 on third order intercept point (IP3) is shown. FIG. 6 shows the measured results of an actual dual mixer constructed according to FIG. 1. Using two mixers in parallel reduces the amount of RF power going to each mixer by 3 dBm. This results in a 6 dBm reduction in intermodulation noise which gives an increase of 3 dB in third order intercept point (IP3). A measured IP3 of 33 to 40 dBm was obtained with a LO power level equal or greater than 17 dBm. Therefore, dual mixer 20 has a high IP3 and high isolation.

Figure 7:
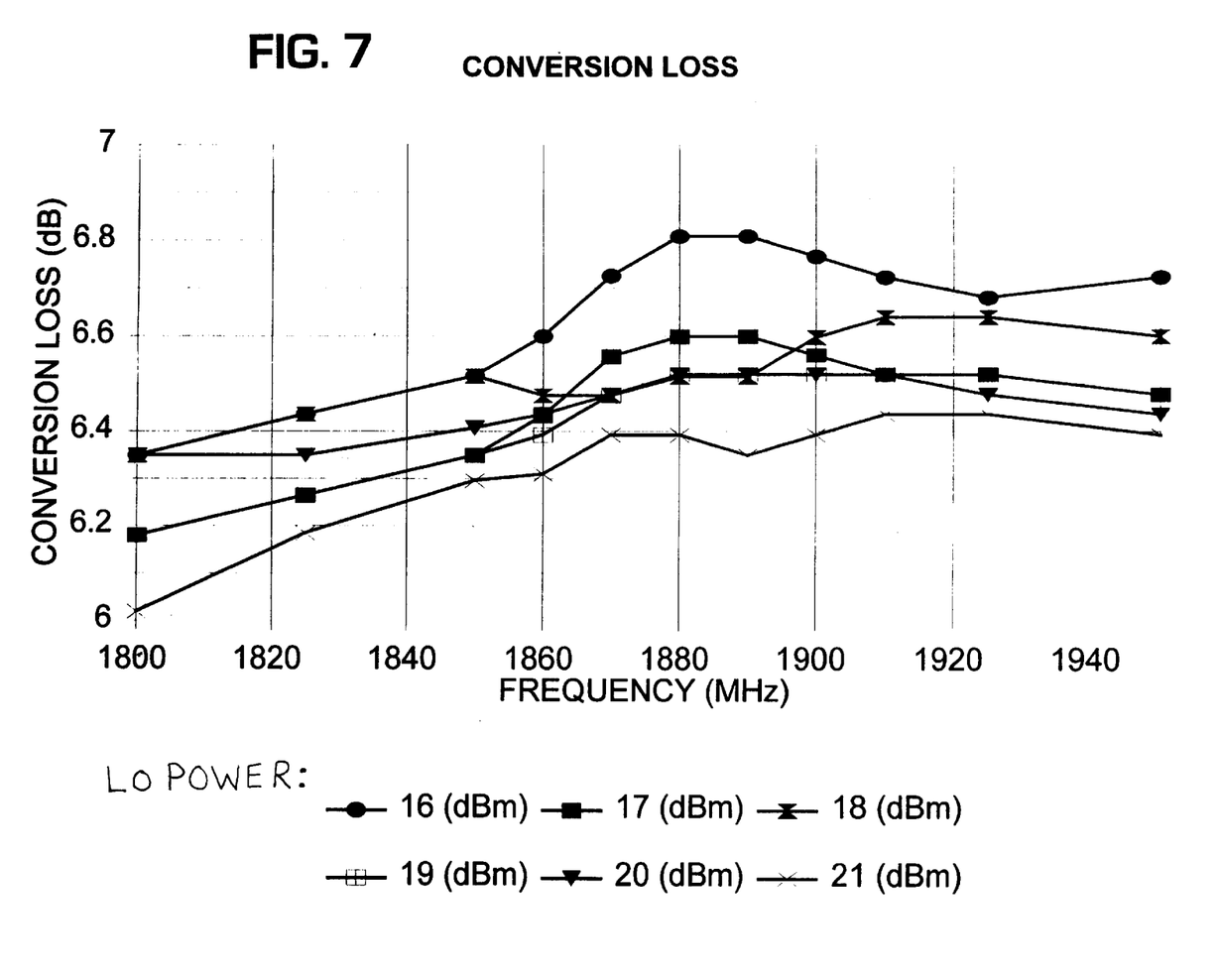
FIG. 7 is a graph of conversion loss versus frequency for the circuit of FIG. 1.

FIG. 7 shows a graph of conversion loss versus frequency for the circuit of FIG. 1 for several power levels. Conversion loss is a measure of the efficiency of the mixer in providing frequency translation between the RF signal and the IF signal.

Figure 8:
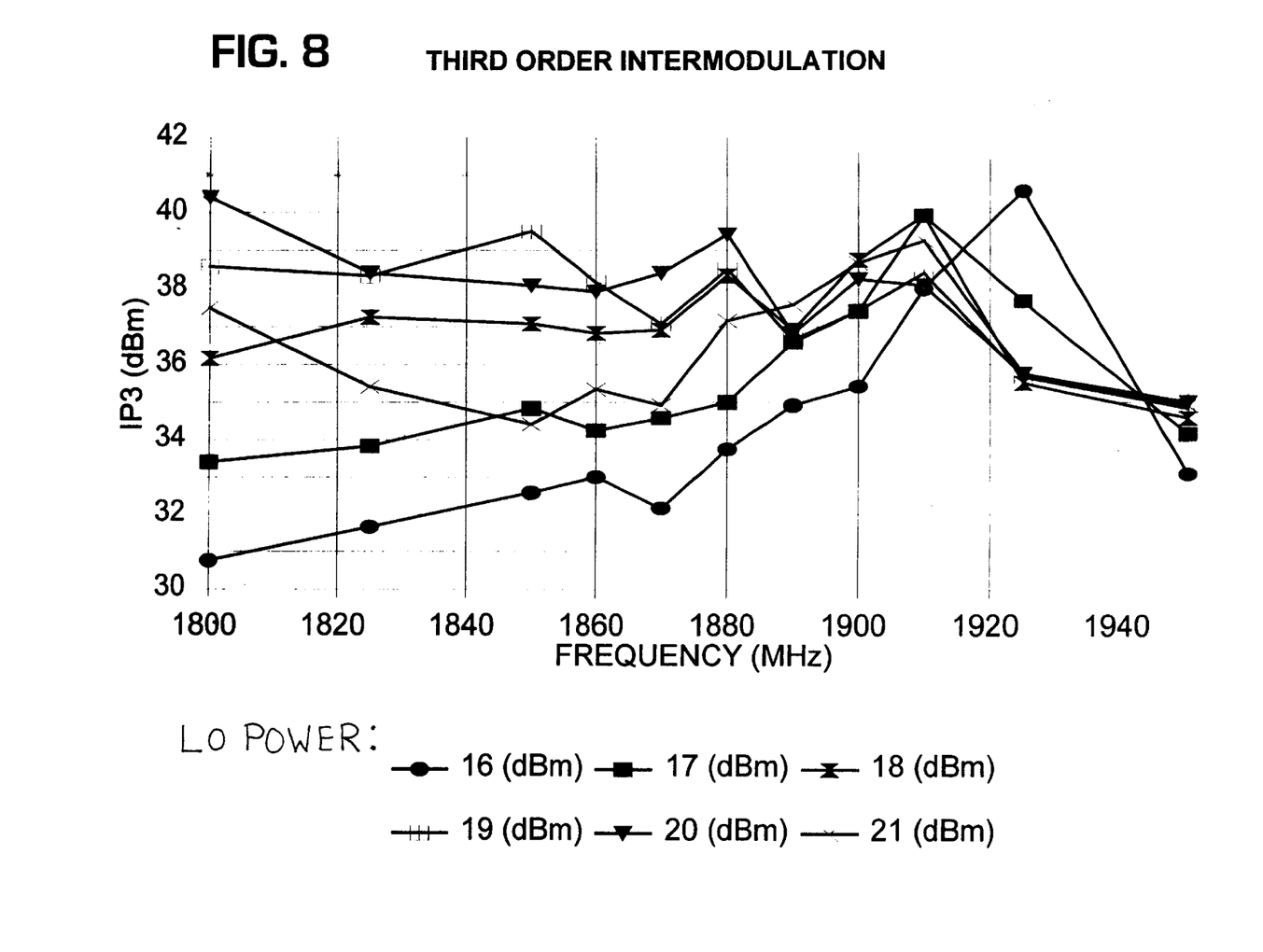
FIG. 8 is a graph of third order intercept point versus frequency for the circuit of FIG. 1.

FIG. 8 shows a graph of third order intercept point versus frequency for the circuit of FIG. 1 for several power levels. Third order intercept point measures the third-order intermodulation distortion which is a measure of the third-order products generated by a second input signal arriving at the output of a mixer along with the desired signal.

Figure 9:
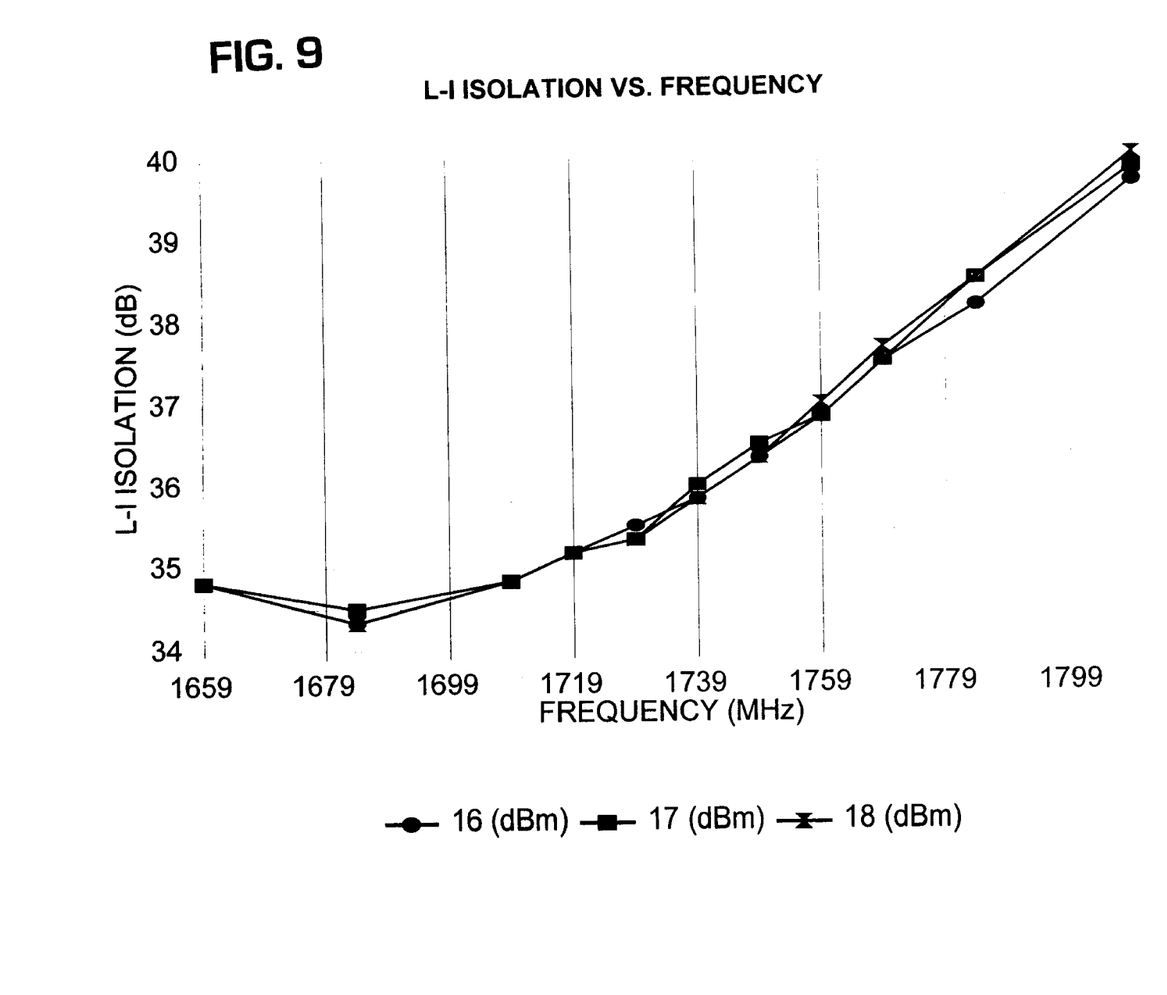
FIG. 9 is a graph of L-I isolation versus frequency for the circuit of FIG. 1.

Referring to FIG. 9, a graph of L-I isolation versus frequency for several power levels for the circuit of FIG. 1 is shown. The graph shows the effect of local oscillator LO leakage on the IF terminal. An L-I isolation of 35 to 40 dB was obtained for the dual mixer. For comparison, a single mixer only provided 18 to 20 dB of isolation.

Figure 10:
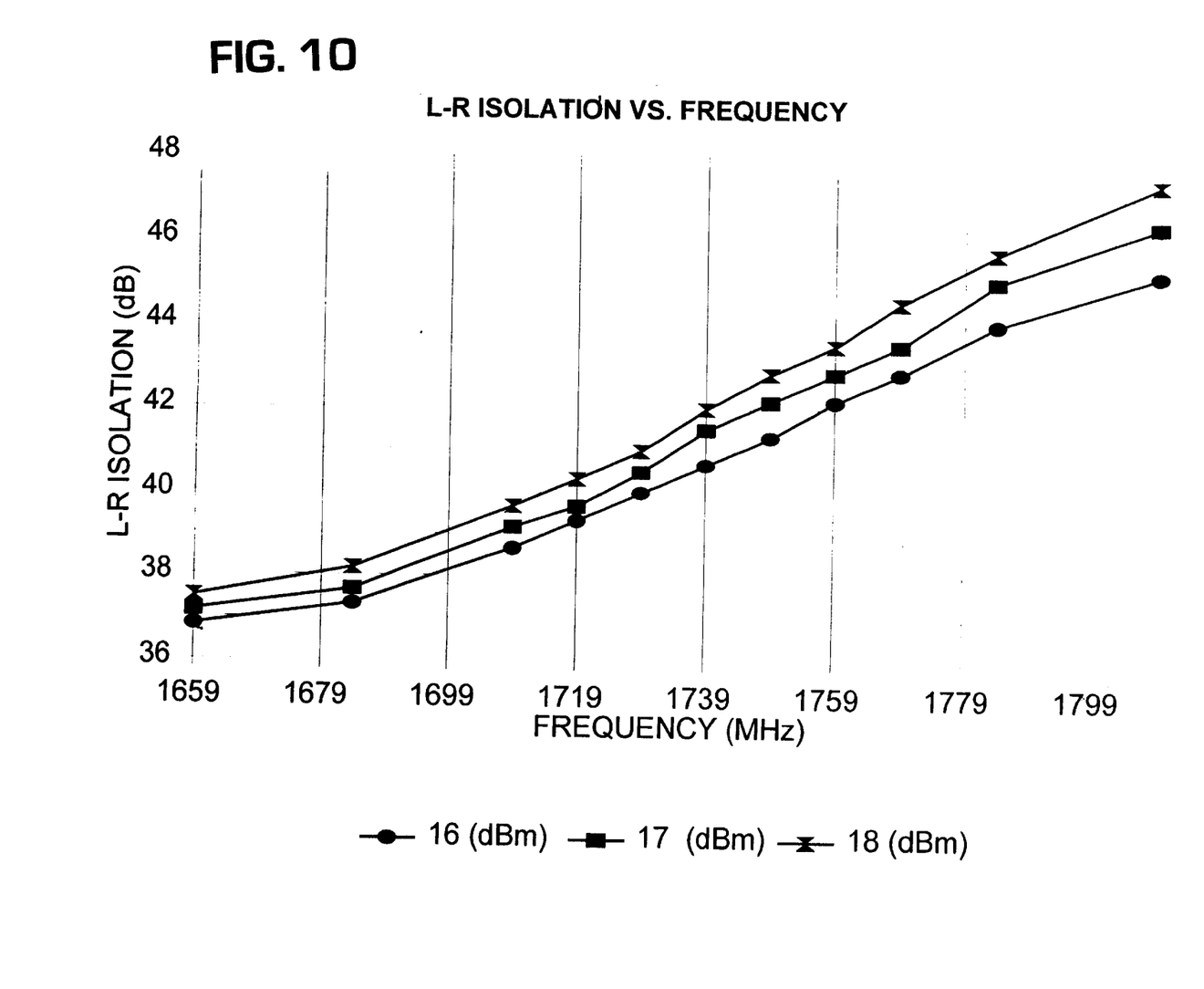
FIG. 10 is a graph of L-R isolation versus frequency for the circuit of FIG. 1.

FIG. 10 shows a graph of L-R isolation versus frequency for several power levels for the circuit of FIG. 1. The graph shows the effect of local oscillator LO leakage on the RF terminal. It is noted that the isolation is on the order of 37 to 47 dB. A single double balanced mixer in comparison would have an isolation of 20 to 25 dB.

Figure 11:
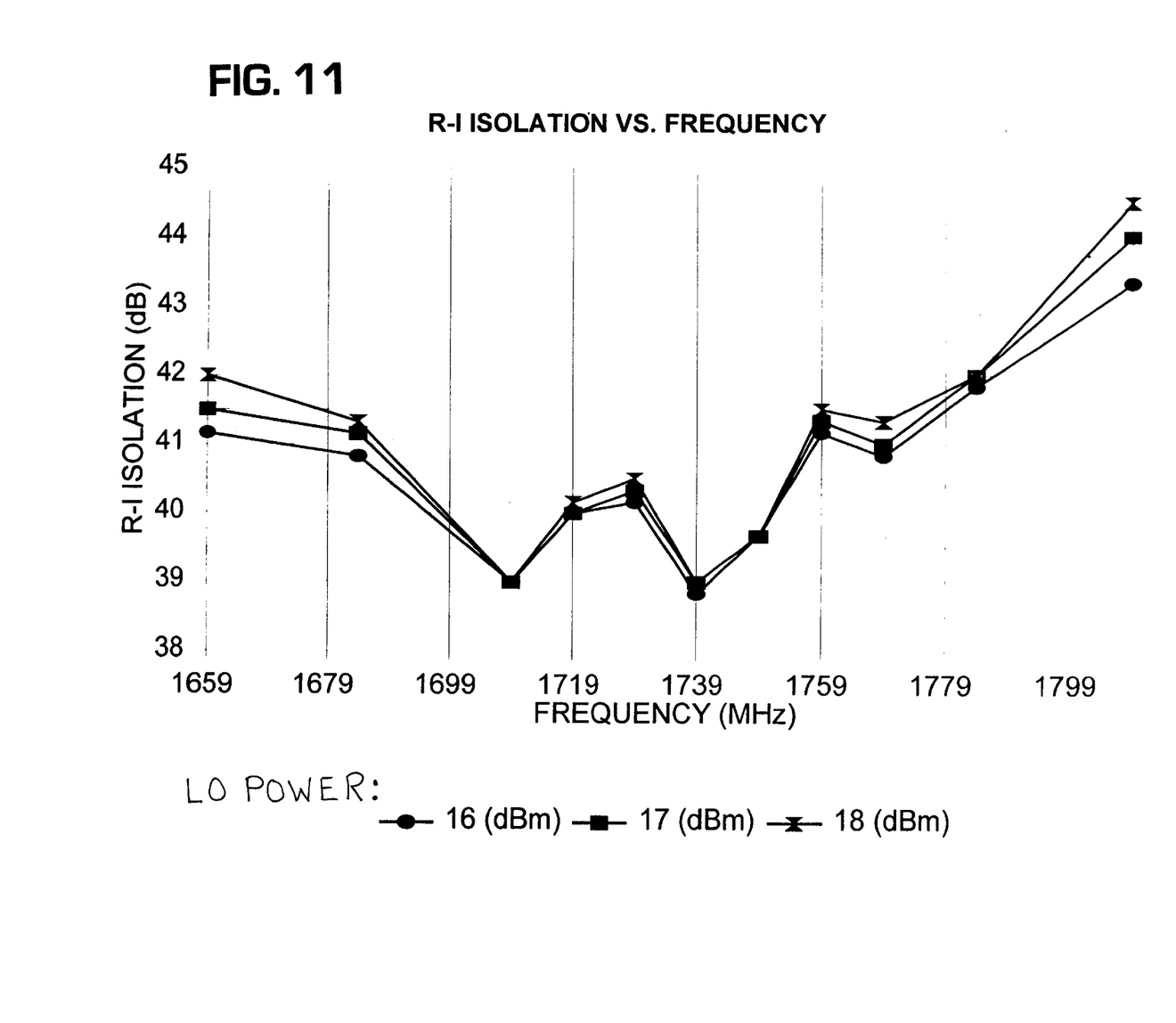
FIG. 11 is a graph of R-I isolation versus frequency for the circuit of FIG. 1.

Referring to FIG. 11, a graph of R-I isolation versus frequency for several LO power levels for the circuit of FIG. 1 is shown. The graph shows the effect of RF leakage on the IF terminal.

Figure 12:
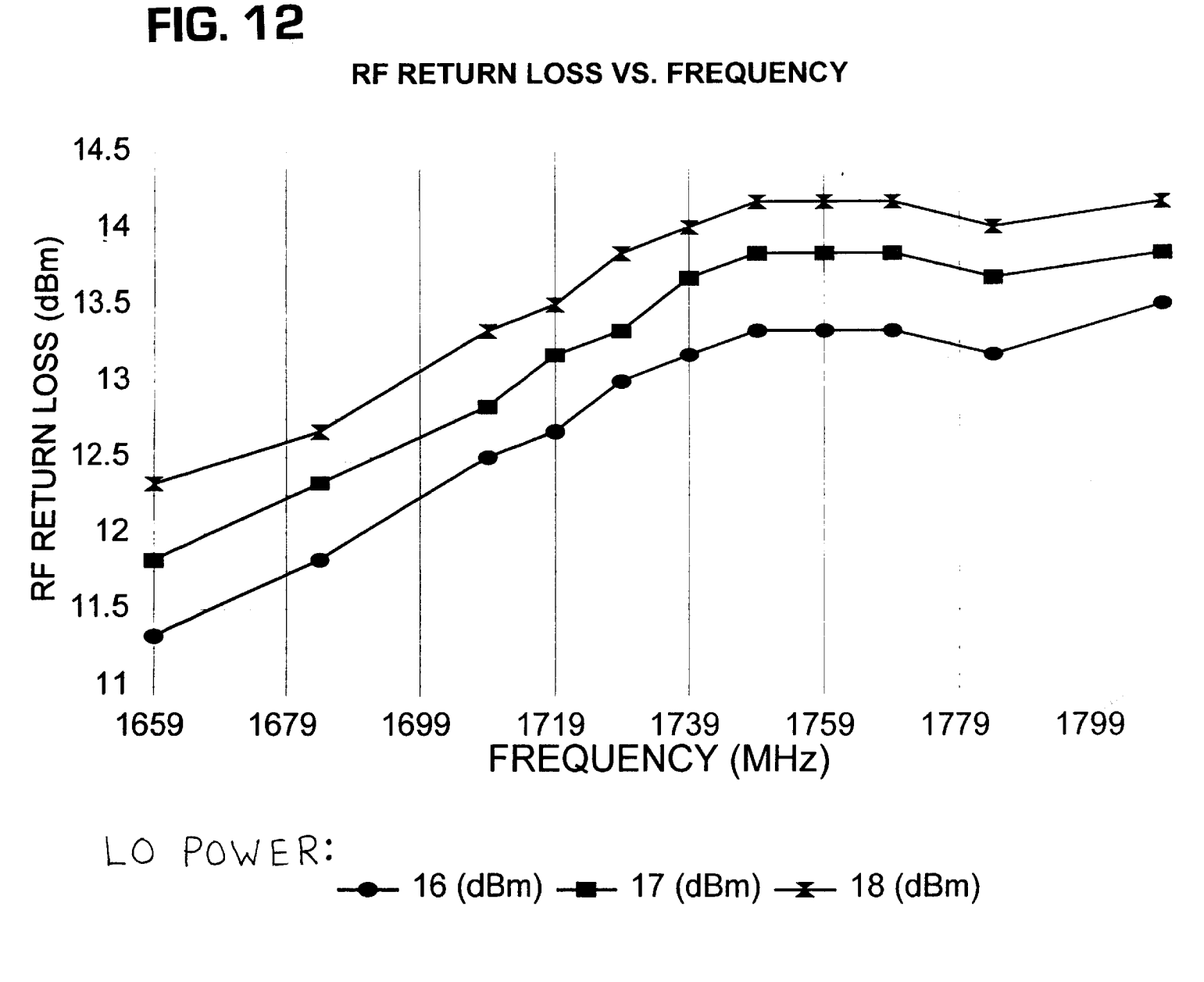
FIG. 12 is a graph of RF return loss versus frequency for the circuit of FIG. 1.

FIG. 12 shows a graph of RF return loss versus frequency for several LO power levels for the circuit of FIG. 1.

Figure 13:
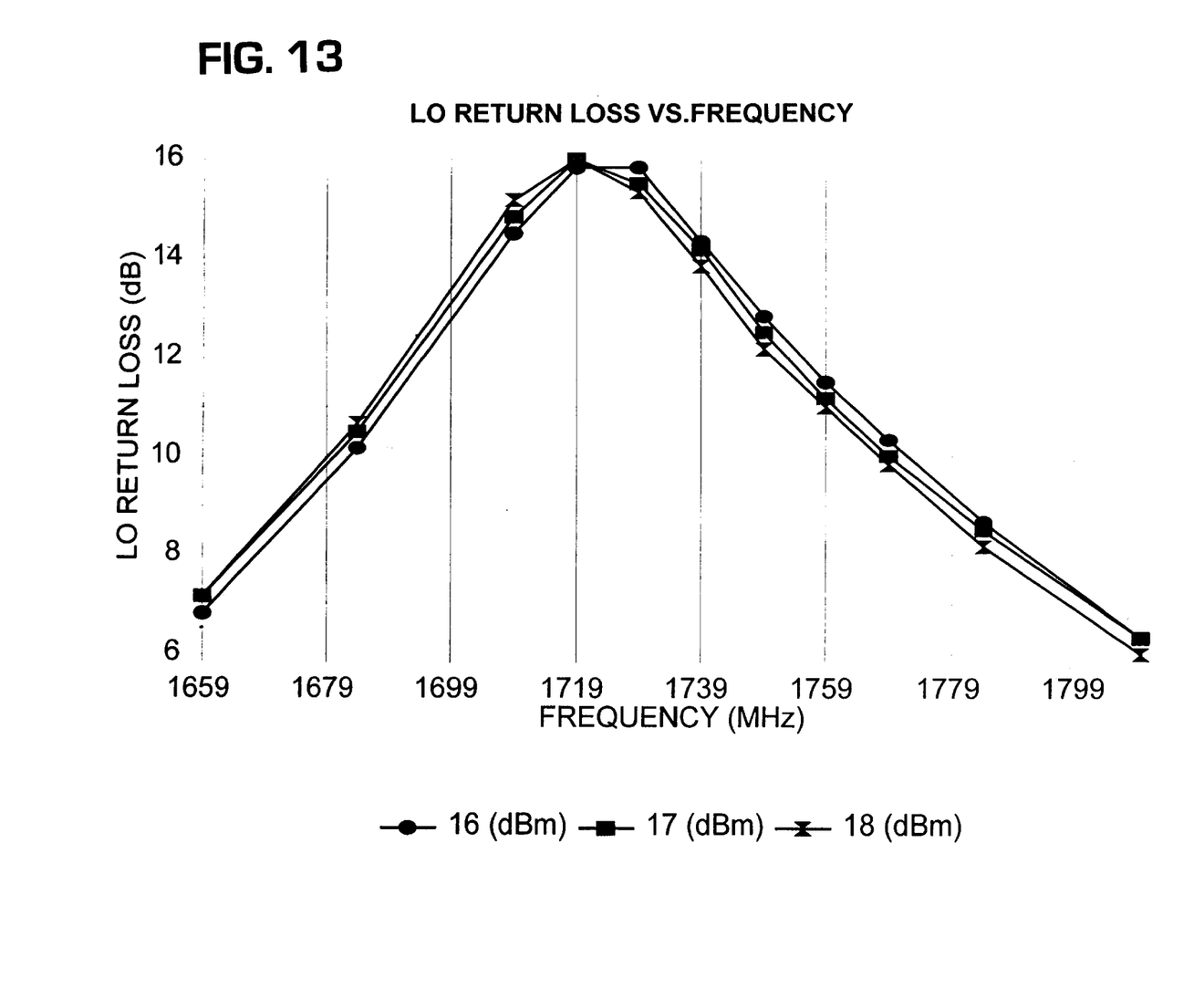
FIG. 13 is a graph of LO return loss versus frequency for the circuit of FIG. 1.

Turning now to FIG. 13, a graph of LO return loss versus frequency for several power levels for the circuit of FIG. 1 is shown.

Figure 14:
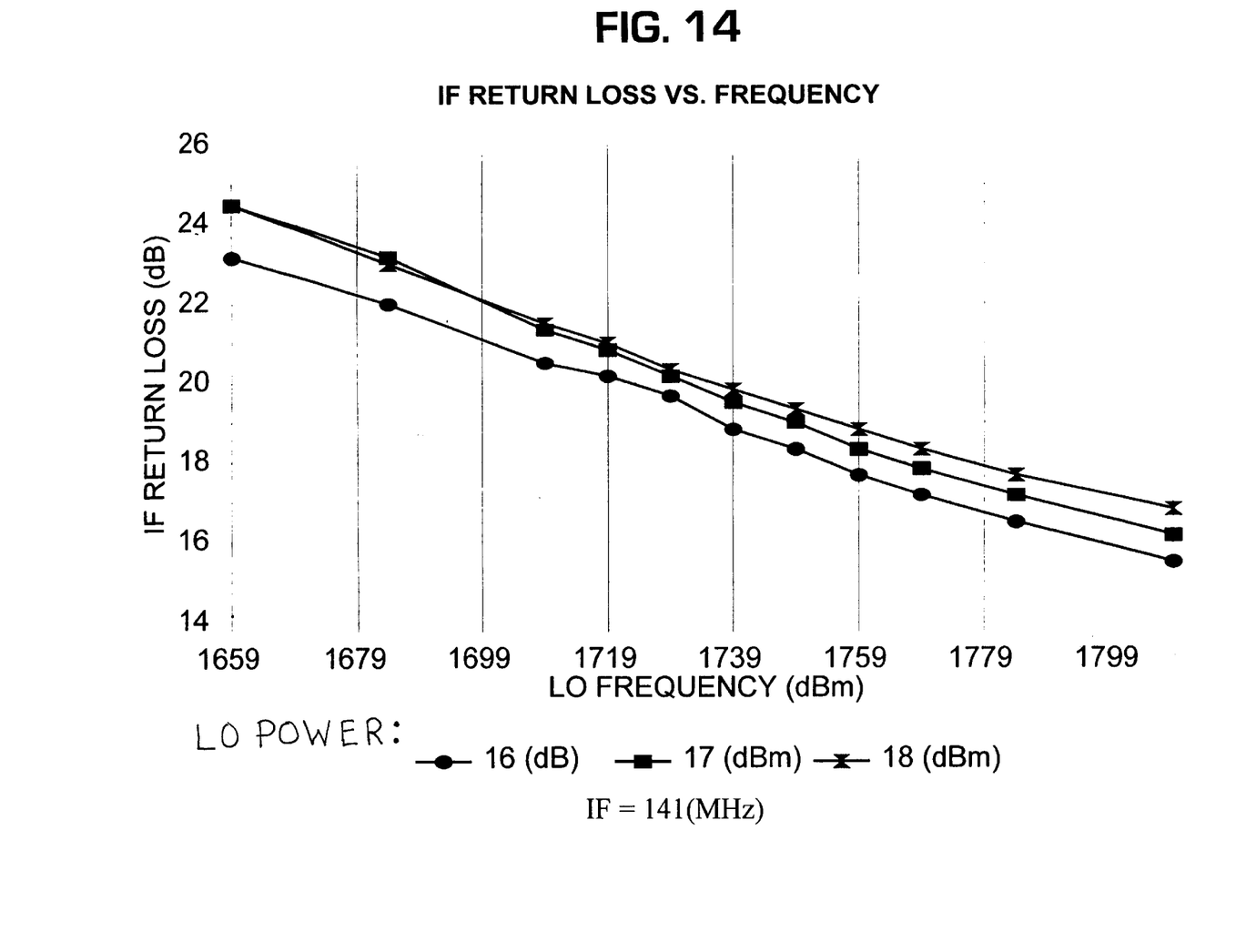
FIG. 14 is a graph of IF return loss versus frequency for the circuit of FIG. 1.

FIG. 14 shows a graph of IF return loss versus frequency for several LO power levels for the circuit of FIG. 1.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A double balanced mixer for mixing an RF input signal with a local oscillator signal to provide at an output an intermediate frequency signal with a high third order intercept point, comprising:
   (a) a first double balanced mixer having a first and second input port for receiving the local oscillator signal, the first mixer having a third and a fourth input port for receiving the RF signal, the first mixer further having a first and second output port for providing the intermediate frequency signal; and
   (b) a second double balanced mixer connected in parallel with the first double balanced mixer, the second double balanced mixer having a fifth and sixth input port for receiving the local oscillator signal, the second mixer having a seventh and eighth input port for receiving the RF signal, the second mixer further having a third and fourth output port for providing the intermediate frequency signal, the parallel connected first and second double balanced mixers reducing third order products and increasing the third order intercept point.

2. The double balanced mixer according to claim 1, further comprising:
   (a) a first local oscillator balun connected to the first and second input ports for receiving the local oscillator signal; and
   (b) a second local oscillator balun connected to the fifth and sixth input ports for receiving the local oscillator signal.

3. The double balanced mixer according to claim 2, further comprising:
   (a) a first RF balun connected to the third and fourth input ports for receiving the RF signal; and
   (b) a second RF balun connected to the seventh and eighth input ports for receiving the RF signal.

4. The double balanced mixer according to claim 3, further comprising:
   (a) a first intermediate frequency balun connected to the first and second output ports for providing the intermediate frequency; and
   (b) a second intermediate frequency balun connected to the third and fourth output ports for providing the intermediate frequency.

5. The double balanced mixer according to claim 4, further comprising:
   (a) a first inductor connected to the first and second RF baluns; and
   (b) a second inductor connected to the first and second intermediate frequency baluns.

6. The double balanced mixer according to claim 4, wherein a first local oscillator leakage signal at the first mixer and a second local oscillator leakage signal from the second mixer cancel each other at the intermediate frequency balun.

7. The double balanced mixer according to claim 6, wherein the mixer provides a high isolation between the local oscillator signal and the intermediate frequency signal.

8. The double balanced mixer according to claim 6, wherein the mixer provides a high isolation between the local oscillator signal and the RF frequency signal.

9. The double balanced mixer according to claim 1, wherein the first and second double balanced mixers are each field effect transistor quads.

10. The double balanced mixer according to claim 9, wherein the field effect transistor quads comprise:
    (a) four field effect transistors each having a gate, drain and a source electrode, with the source electrodes of the first and second transistors connected together to form the third input port, the source electrodes of the third and fourth transistors connected together to form the fourth input port, the third and fourth input ports receiving the RF signal, the drain electrodes of the first and third transistors connected together to form the first output port, the drain electrodes of the second and fourth transistors connected together to form the second output port, the gate electrodes of the second and third transistors connected together to form the first input port, the gate electrodes of the first and fourth transistors connected together to form the second input port.

11. The double balanced mixer according to claim 10, wherein the field effect transistor quads have metal oxide semiconductor field effect transistors.

12. A double balanced mixer, comprising:
    (a) a first and second local oscillator balun operable to receive a local oscillator signal;
    (b) a first and second RF balun operable to receive a RF signal;
    (c) a first mixer having a first input port coupled to the first local oscillator balun, a second input port coupled to the first RF balun, and an output port providing an intermediate frequency signal;
    (d) a second mixer coupled in parallel with the first mixer, the second mixer having a first input port coupled to the second local oscillator balun, a second input port coupled to the second RF balun, and an output port providing an intermediate frequency signal; and
    (e) a first and second intermediate frequency balun, the first intermediate frequency balun coupled to the output port of the first mixer and the second intermediate frequency balun coupled to the output port of the second mixer, the parallel connected first and second mixers providing a high third order intercept point.

13. The double balanced mixer according to claim 12, wherein the first and second mixers are each field effect transistor quads.

14. The double balanced mixer according to claim 13, wherein the field effect transistors are metal oxide semiconductor field effect transistors.

15. The double balanced mixer according to claim 12, further comprising:
    (a) a first inductor connected to the first and second RF baluns; and
    (b) a second inductor connected to the first and second intermediate frequency baluns.

16. A method of double balanced mixing with a high third order intercept point, comprising:
    (a) applying a local oscillator signal to a first and second double balanced mixer, the first and second mixers connected in parallel, the first mixer having a first and second input port for receiving the local oscillator signal, a third and a fourth input port for receiving a RF signal and a first and second output port, the second double balanced mixer having a fifth and sixth input port for receiving the local oscillator signal, a seventh and eighth input port for receiving the RF signal and a third and fourth output port for providing an intermediate frequency signal;
    (b) applying an RF signal to the first and second mixers;
    (c) mixing the local oscillator signal with the RF signal in the first and second mixers to obtain an intermediate frequency signal; and
    (d) providing the intermediate frequency signal at an output.

17. The method of double balanced mixing according to claim 16, further comprising:
    (a) providing a first local oscillator balun connected to the first and second input ports for receiving the local oscillator signal;
    (b) providing a second local oscillator balun connected to the fifth and sixth input ports for receiving the local oscillator signal;
    (c) providing a first RF balun connected to the third and fourth input ports for receiving the RF signal;
    (d) providing a second RF balun connected to the seventh and eighth input ports for receiving the RF signal;
    (e) providing a first intermediate frequency balun connected to the first and second output ports for providing the intermediate frequency; and
    (f) providing a second intermediate frequency balun connected to the third and fourth output ports for providing the intermediate frequency.

18. The method of double balanced mixing according to claim 17, wherein the first and second double balanced mixers are each field effect transistor quads.

19. The method of double balanced mixing according to claim 18, wherein the field effect transistor quads have metal oxide semiconductor field effect transistors.

20. The method of double balanced mixing according to claim 18, further comprising:

(a) connecting a first inductor to the first and second RF baluns; and (b) connecting a second inductor to the first and second intermediate frequency baluns.

21. A double balanced mixer for mixing an RF signal with a local oscillator signal to provide at an output an intermediate frequency signal with a high third order intercept point, comprising:

(a) first and second local oscillator balun means for receiving a local oscillator signal;

(b) first and second RF balun means for receiving an RF signal;

(c) parallel coupled first and second mixer means, the first and second mixer means further coupled to the first and second local oscillator balun means and the first and second RF balun means, respectively; the first and second mixing means mixing the local oscillator signal and the RF signal to produce an intermediate frequency signal having a high third order intercept point;

(d) first and second intermediate frequency balun means coupled to the first and second mixer means; and (e) a first capacitor connected between the first and second local oscillator balun means and the local oscillator signal and a second capacitor connected between the RF signal and ground.

* * * * *